(12) United States Patent
Kim et al.

(10) Patent No.: US 12,425,008 B2
(45) Date of Patent: Sep. 23, 2025

(54) BROADBAND IMPULSE GENERATOR

(71) Applicant: UIF (University Industry Foundation), Yonsei University, Seoul (KR)

(72) Inventors: Tae Wook Kim, Seoul (KR); Junyoung Jang, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 430 days.

(21) Appl. No.: 17/992,792

(22) Filed: Nov. 22, 2022

(65) Prior Publication Data

US 2023/0170888 A1 Jun. 1, 2023

(30) Foreign Application Priority Data

Nov. 29, 2021 (KR) .................. 10-2021-0166371

(51) Int. Cl.
*H03K 3/64* (2006.01)
*H03K 5/06* (2006.01)

(52) U.S. Cl.
CPC .................. *H03K 5/06* (2013.01); *H03K 3/64* (2013.01)

(58) Field of Classification Search
None
See application file for complete search history.

(56) References Cited

U.S. PATENT DOCUMENTS

| | | | |
|---|---|---|---|
| 5,451,911 A * | 9/1995 | Colvin | H03K 3/0315 331/25 |
| 6,026,125 A | 2/2000 | Larrick, Jr. et al. | |
| 6,222,406 B1 * | 4/2001 | Noda | G11C 7/22 327/269 |

(Continued)

FOREIGN PATENT DOCUMENTS

| JP | 4365795 A | 11/2009 |
|---|---|---|
| KR | 10-2009-0028286 A | 3/2009 |

(Continued)

OTHER PUBLICATIONS

Dang Liu, et al., "A 19.2mW 1Gb/s Secure Proximity Transceiver with ISI PreCorrection and Hysteresis Energy Detection", 2016 IEEE Radio Frequency Integrated Circuits Symposium, 4 pages.

(Continued)

*Primary Examiner* — Idowu O Osifade
(74) *Attorney, Agent, or Firm* — Park, Kim & Suh, LLC

(57) ABSTRACT

A broadband impulse generator includes a first delay line and a second delay line that receive an input signal and include a plurality of delay elements connected in series with each other, an oscillation signal generator that generates an oscillation signal having a certain number of pulses during a target impulse duration based on the input signal and an output signal of the first delay line, an envelope signal generator that generates a plurality of envelope signals having a delay duration with each other and having a certain voltage level during the target impulse duration, based on the input signal and an output signal of the second delay line, and an impulse signal generator that generates an impulse signal having the certain number of pulses during the target impulse duration based on the plurality of impulse signals and the oscillation signal.

12 Claims, 8 Drawing Sheets

(56) References Cited

U.S. PATENT DOCUMENTS

2007/0210848 A1* 9/2007 Jimenez ............... H04B 1/7174
327/291
2013/0120031 A1* 5/2013 Jung .................. H03K 5/00006
327/119

FOREIGN PATENT DOCUMENTS

| KR | 10-2012-0061398 A | 6/2012 |
|---|---|---|
| KR | 10-2015-0102548 A | 9/2015 |
| KR | 10-2169186 B1 | 10/2020 |

OTHER PUBLICATIONS

M. Ware, et al., "Group Delay Description For Broadband Pulses", DOI: 10.1007/978-1-4419-9146-1_1, 9 pages.

* cited by examiner

BROADBAND IMPULSE GENERATOR

CROSS-REFERENCE TO RELATED APPLICATIONS

A claim for priority under 35 U.S.C. § 119 is made to Korean Patent Application No. 10-2021-0166371 filed on Nov. 29, 2021, in the Korean Intellectual Property Office, the entire contents of which are hereby incorporated by reference.

BACKGROUND

Embodiments of the inventive concept described herein relate to a low-power broadband impulse generator using a delay line structure.

In general, a broadband impulse generator may multiply and generate a local oscillation (LO) signal generated by an oscillator and an envelope signal for determining a shape of an impulse signal by means of a mixer. Meanwhile, the impulse signal may be generated only during a specified time and may be maintained with no signal in the other time.

However, the oscillator included in the broadband impulse generator may continuously operate to generate an LO signal even during a time where the impulse signal is not required. This may cause excessive power consumption.

Furthermore, there is a need for additional equipment to remove a phase difference which occurs between the LO signal generated by the oscillator and the envelope signal and perform synchronization.

Thus, there is a need for a technology for generating an LO signal and an envelope signal only during a time when the impulse signal is required to reduce power consumption and performing synchronization therebetween to remove a phase difference.

The inventive concept is derived from research conducted as part of ICT Convergence Industry Innovation Technology Development (R&D) by Ministry of Science and ICT (Project No.: 1711126437, Project No.: 2017-0-00418-005, Research project name: Time domain artificial intelligence radar SoC (System On a Chip) design study using ultra-high-speed sampling technique, project management institution: Information and Communication Planning and Evaluation Institute, task performing institution: Yonsei University Industry-Academic Cooperation Foundation, research period: 2021.01.01~2021.12.31. Meanwhile, there is no property interest of the Korean government in any aspect of the inventive concept.

SUMMARY

Embodiments of the inventive concept provide a broadband impulse generator for generating a local oscillation (LO) signal and an envelope signal only during a time when an impulse signal is required.

Embodiments of the inventive concept provide a broadband impulse generator for synchronizing an LO signal with an envelope signal to remove a phase difference.

According to an embodiment, a broadband impulse generator may include a first delay line and a second delay line that receive an input signal and include a plurality of delay elements connected in series with each other, an oscillation signal generator that generates an oscillation signal having a certain number of pulses during a target impulse duration based on the input signal and an output signal of the first delay line, an envelope signal generator that generates a plurality of envelope signals having a delay duration with each other and having a certain voltage level during the target impulse duration, based on the input signal and an output signal of the second delay line, and an impulse signal generator that generates an impulse signal having the certain number of pulses during the target impulse duration based on the plurality of impulse signals and the oscillation signal.

Furthermore, the oscillation signal generator according to an embodiment of the inventive concept may include a plurality of first AND gates connected with an input terminal and an output terminal of a 2n–1st delay element to AND a signal applied to the input terminal and a signal output from the output terminal to generate sub-oscillation signals, a signal synthesizer connected with the plurality of first AND gates to OR the sub-oscillation signals to generate the oscillation signal, and an oscillation signal output device that outputs the oscillation signal to the impulse signal generator, where n is a natural number greater than or equal to 1.

Furthermore, the plurality of delay elements according to an embodiment of the inventive concept may be a plurality of inverter elements. The first delay line may include at least one first switch and at least one first capacitor between the plurality of inverter elements.

Furthermore, the oscillation signal generator according to an embodiment of the inventive concept may change a phase of the input signal to the opposite and may delay the input signal by a first delay duration to generate a first output delay signal, may change a phase of a 2n–3rd output delay signal to the opposite and may delay the 2n-3-rd output delay signal by the first delay duration to generate a 2n–2nd output delay signal, and may change a phase of the 2n–2nd output delay signal to the opposite and may delay the 2n–2nd output delay signal by the first delay duration to generate a 2n–1st output delay signal. A 0th output delay signal may be the same signal as the input signal.

Furthermore, the plurality of first AND gates according to an embodiment of the inventive concept may AND the input signal and the first output delay signal to generate a first sub-oscillation signal and may AND the 2n–2nd output delay signal and the 2n–1st output delay signal to generate an nth sub-oscillation signal.

Furthermore, the signal synthesizer according to an embodiment of the inventive concept may OR the first to nth sub oscillation signals to generate the oscillation signal having the certain number of pulses during the target impulse duration.

Furthermore, the envelope signal generator according to an embodiment of the inventive concept may include a plurality of second AND gates connected with an input terminal of a pth delay element and an output terminal of a p+2n–2nd delay element to AND a signal applied to the input terminal and a signal output from the output terminal to generate the plurality of envelope signals and an envelope signal output unit connected with each of the plurality of second AND gates to output the plurality of envelope signals to the impulse signal generator, where n is a natural number greater than or equal to 1 and p is a natural number greater than or equal to 1 and is less than or equal to 2n–1.

Furthermore, the plurality of delay elements according to an embodiment of the inventive concept may be a plurality of inverter elements. The second delay line may include at least one second switch and at least one second capacitor between the plurality of inverter elements.

Furthermore, the envelope signal generator according to an embodiment of the inventive concept may change a phase of the input signal to the opposite and may delay the input signal by a second delay duration to generate a first envelope delay output signal, may change a phase of a 2p–2nd envelope delay output signal to the opposite and may delay the 2p–2nd envelope delay output signal by the second delay duration to generate a 2p–1st envelope delay output signal, and may change a phase of the 2p–1st envelope delay output signal to the opposite and may delay the 2p–1st envelope delay output signal by the second delay duration to generate a 2pth envelope delay output signal.

Furthermore, the plurality of second AND gates according to an embodiment of the inventive concept may AND the input signal and the first envelope delay output signal to generate a first envelope signal having the certain voltage level during the target impulse duration, may AND the 2p–2nd envelope delay output signal and the 2p–1st envelope delay output signal to generate a p–1st envelope signal having the certain voltage level during the target impulse duration, and may AND the 2p–2nd envelope delay output signal and the 2p–1st envelope delay output signal to generate a pth envelope signal having the certain voltage level during the target impulse duration.

Furthermore, the impulse signal generator according to an embodiment of the inventive concept may include a plurality of logic gates that receive the oscillation signal and any one of the plurality of envelope signals, a first transistor connected with the plurality of logic gates, and a second transistor connected with the plurality of logic gates and connected in parallel with the first transistor.

Furthermore, each of the plurality of logic gates according to an embodiment of the inventive concept may include a first inverter element that receives the envelope signal, a second inverter element that receives the envelope signal passing through the first inverter element, a NAND gate that receives the oscillation signal and the envelope signal passing through the first inverter element and the second inverter element, and a NOR gate that receives the oscillation signal and the envelope signal passing through the second inverter element.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
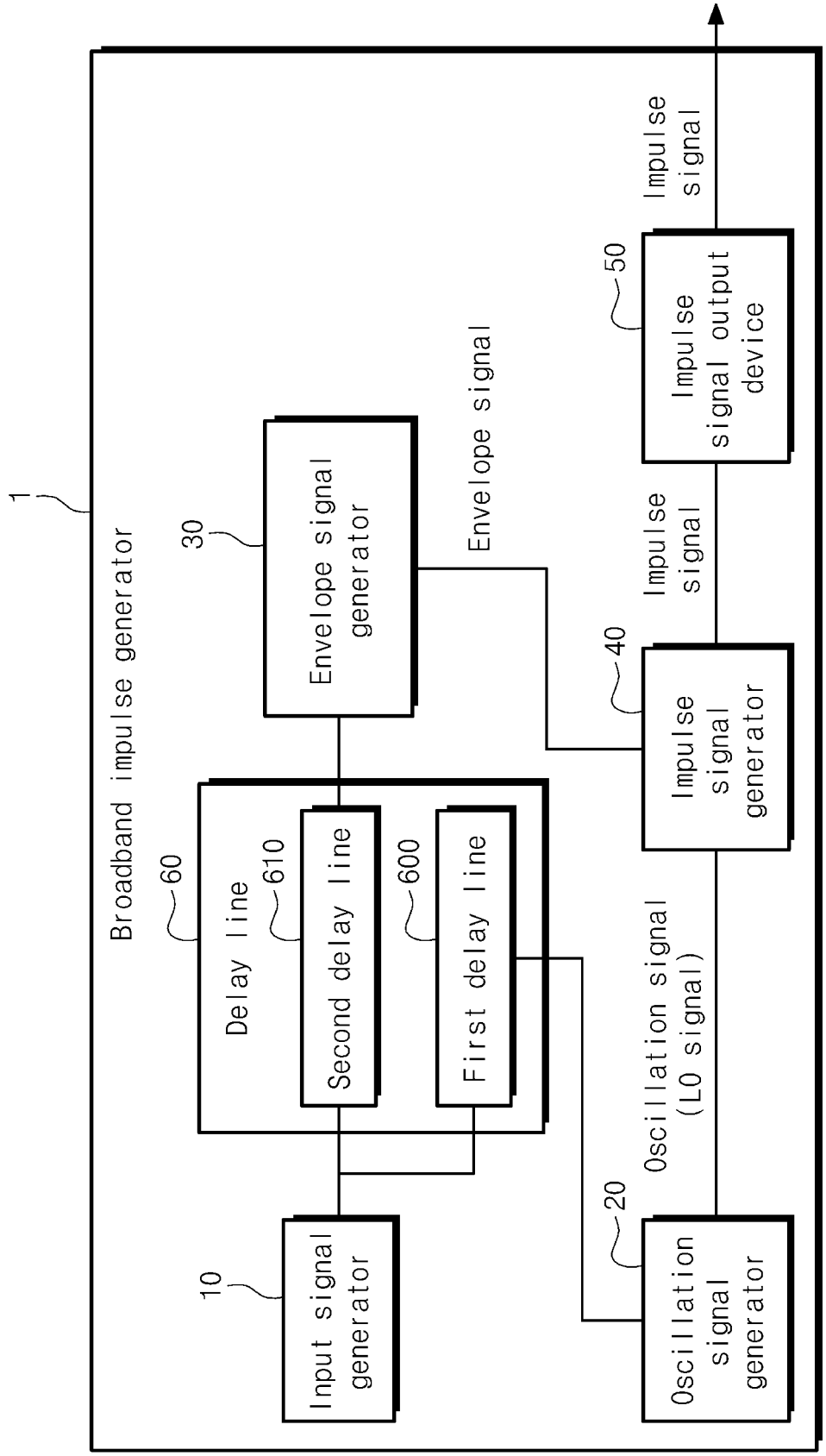
FIG. 1 is a drawing illustrating a broadband impulse generator according to an embodiment of the inventive concept.

Hereinafter, various embodiments of the inventive concept will be described more fully with reference to the accompanying drawings to such an extent as to be easily embodied by one skilled in the art. the inventive concept may be embodied in many different forms and should not be construed as limited to the embodiments set forth herein.

In drawings, components or elements not associated with the detailed description may be omitted to describe the inventive concept clearly, and like reference numerals refer to like elements throughout this application. Therefore, the reference numerals described above may be used in other drawings.

In addition, the size and thickness of each component shown in the drawings may be exaggerated for convenience of description. The inventive concept is not limited by the embodiments shown in the drawings. In the drawings, the thickness may be exaggerated in order to clearly express various layers and regions.

In addition, the expression "equal to or the same as" in the description may mean "substantially equal to or the same as". That is, it may be the same enough to convince those skilled in the art to be the same. Even other expressions may be expressions from which "substantially" is omitted.

FIG. 1 is a drawing illustrating a broadband impulse generator according to an embodiment of the inventive concept.

A broadband impulse generator 1 an embodiment of the inventive concept may include an input signal generator 10, an oscillation signal generator 20, an envelope signal generator 30, an impulse signal generator 40, an impulse signal output device 50, and a delay line 60.

The input signal generator 10 may generate and apply an input signal $IS_1$ (refer to FIG. 2) to the delay line 60. The input signal $IS_1$ generated by the input signal generator 10 may be applied in common to a first delay line 600 and a second delay line 610. The oscillation signal generator 20 may generate an oscillation signal (or an LO signal) based on the input signal IS1, and the envelope signal generator 30 may generate an envelope signal based on the input signal IS1.

Because the input signal $IS_1$ generated by the input signal generator 10 is applied in common to the first delay line 600 and the second delay line 610, the oscillation signal (or the LO signal) and the envelope signal may be synchronized and a phase difference may not occur.

The oscillation signal generator 20 may be connected with the first delay line 600 included in the delay line 60. The oscillation signal generator 20 may generate an oscillation signal (or an LO signal) having a certain number of pulses during an impulse generation duration (or a target impulse duration) based on the input signal $IS_1$ applied to the first delay line 600 and an output signal (or an output delay signal) of the first delay line 600.

The oscillation signal generator 20 may apply the oscillation signal (or the LO signal) to the impulse signal generator 40 for generating an impulse signal.

The process where the oscillation signal generator 20 generates the oscillation signal (or the LO signal) based on the input signal IS1 and the output signal (or the output delay signal) of the first delay line 600 will be described in detail below with reference to FIGS. 2 and 3.

The envelope signal generator 30 may be connected with the second delay line 610 included in the delay line 60. The envelope signal generator 30 may generate a plurality of envelope signals, which have a delay duration with each other and have a certain voltage level during the impulse generation duration (or the target impulse duration), based on the input signal IS1 applied to the second delay line 610 and an output signal (or an envelope delay output signal) of the second delay line 610.

The envelope signal generator 30 may apply the plurality of envelope signals to the impulse signal generator 40 for generating an impulse signal.

The process where the envelope signal generator 30 generates the plurality of envelope signals based on the input signal $IS_1$ and the output signal (or the envelope delay output signal) of the second delay line 610 will be described in detail below with reference to FIGS. 4 and 5.

The impulse signal generator 40 may generate an impulse signal having a certain number of pulses during the target impulse duration based on the plurality of envelope signals generated by the envelope signal generator 30 and the oscillation signal generated by the oscillation signal generator 20.

The process where the impulse signal generator 40 generates the impulse signal based on the plurality of envelope signals and the oscillation signal will be described in detail below with reference to FIGS. 6 to 8.

The impulse signal output device 50 may output the impulse signal, received from the impulse signal generator 40, to the outside.

The delay line 60 may include the first delay line 600 and the second delay line 610. The first delay line 600 may include a plurality of first delay elements $D_{1a}, D_{2a}, \ldots,$ and $D_{(2n-1)a}$ (refer to FIG. 2) connected in series with each other and at least one first switch $S_{1a}, S_{2a}, \ldots,$ and $S_{(2n-1)a}$ and at least one first capacitor $C_{1a}, C_{2a}, \ldots,$ and $C_{(2n-1)a}$ between the plurality of first delay element $D_{1a}, D_{2a}, \ldots,$ and $D_{(2n-1)a}$.

The second delay line 610 may include a plurality of second delay elements $D_{1b}, D_{2b}, \ldots, D_{(2n-1)b}, \ldots,$ and $D_{(4n-3)b}$ (refer to FIG. 4) connected in series with each other and at least one second switch $S_{1b}, S_{2b}, \ldots S_{(2n-1)b}, \ldots,$ and $S_{(4n-3)b}$ and at least one second capacitor $C_{1b}, C_{2b}, C_{(2n-1)b}, \ldots, C_{(4n-3)b}$ between the plurality of second delay element $D_{1b}, D_{2b}, \ldots, D_{(2n-1)b}, \ldots,$ and $D_{(4n-3)b}$.

The first delay line 600 may change a phase of the input signal $IS_1$ applied from the input signal generator 10 and may delay the input signal $IS_1$ by a certain delay duration to generate output delay signals $DIS_1, DIS_2, \ldots,$ and $DIS_{2n-1}$. The first delay line 600 may apply the input signal $IS_1$ and the output delay signals $DIS_1, DIS_2, \ldots,$ and $DIS_{2n-1}$ to the oscillation signal generator 20.

The process where the first delay line 600 changes the phase of the input signal $IS_1$ to generate the output delay signals $DIS_1, DIS_2, \ldots,$ and $DIS_{2n-1}$ will be described in detail below with reference to FIGS. 2 and 3.

The second delay line 610 may change a phase of the input signal $IS_1$ applied from the input signal generator 10 and may delay the input signal $IS_1$ by a certain delay duration to generate envelope delay output signals $DEIS_1, DEIS_2, DEIS_3, \ldots$. The second delay line 610 may apply the input signal $IS_1$ and the envelope delay output signals $DEIS_1, DEIS_2, DEIS_3, \ldots$ to the envelope signal generator 30.

The process where the second delay line 610 changes the phase of the input signal $IS_1$ to generate the envelope delay output signals $DEIS_1, DEIS_2, DEIS_3, \ldots$ will be described in detail below with reference to FIGS. 4 and 5.

Figure 2:
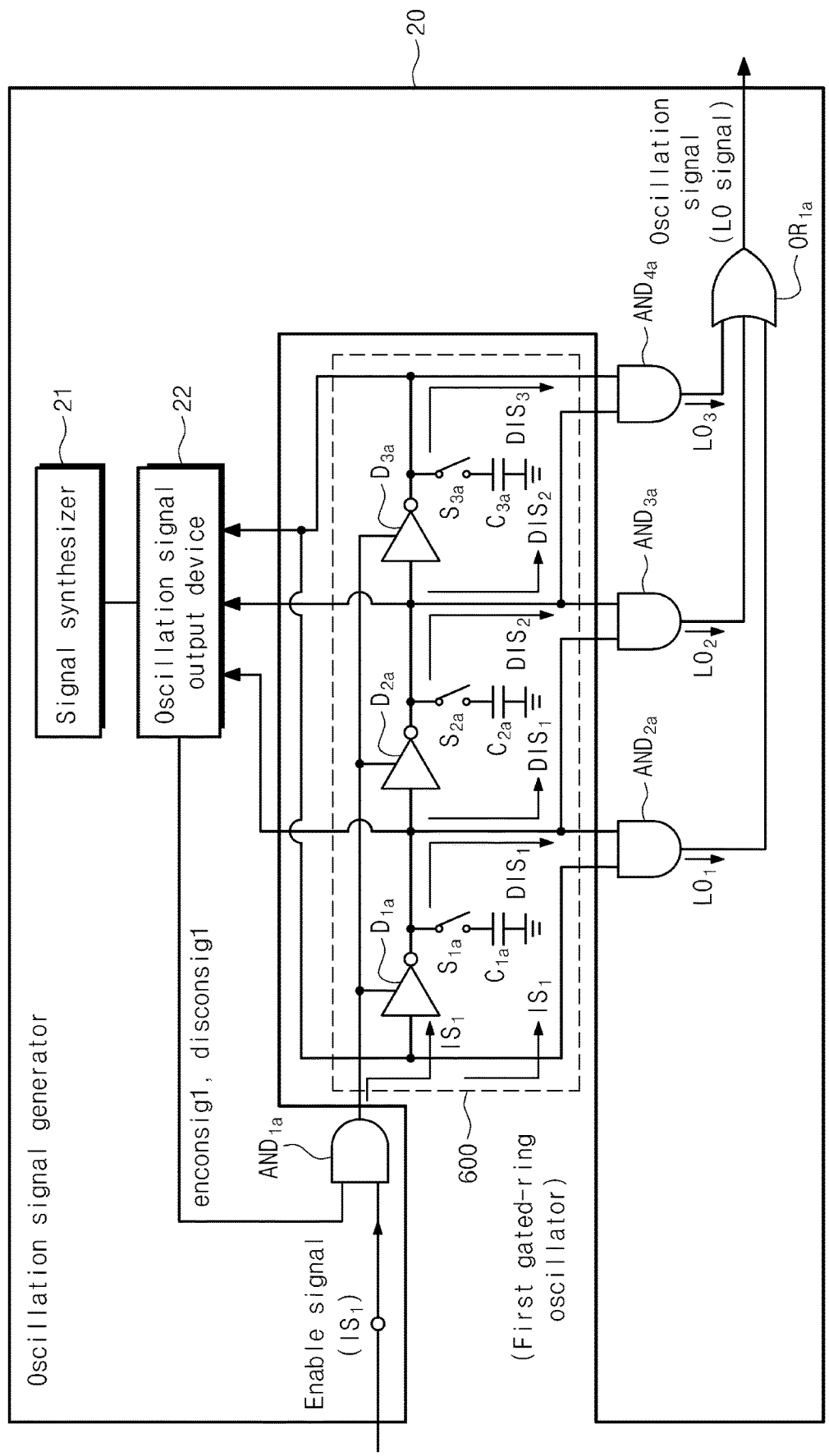
FIG. 2 is a drawing illustrating an oscillation signal generator and a delay line according to an embodiment of the inventive concept.

FIG. 2 is a drawing illustrating an oscillation signal generator and a delay line according to an embodiment of the inventive concept. FIG. 3 is a waveform diagram illustrating a process of generating an oscillation signal according to an embodiment of the inventive concept.

Hereinafter, a description will be given of a process of processing an oscillation signal (an LO signal) in an oscillation signal generator 20 and a first delay line 600 with reference to FIGS. 2 and 3.

Referring to FIG. 2, the first delay line 600 may include a plurality of first delay elements $D_{1a}, D_{2a}, \ldots,$ and $D_{(2n-1)a}$ connected in series with each other and at least one first switch $S_{1a}, S_{2a}, \ldots$ and $S_{(2n-1)a}$ and at least one first capacitor $C_{1a}, C_{2a}, \ldots,$ and $C_{(2n-1)a}$ between the plurality of first delay element $D_{1a}, D_{2a}, \ldots,$ and $D_{(2n-1)a}$. At this time, n is a natural number greater than or equal to 1, and the delay element is an inverter element.

The first delay line 600 may generate output delay signals $DIS_1, DIS_2, \ldots,$ and $DIS_{2n-1}$ based on the input signal $IS_1$ applied from an input signal generator 10. The first delay line 600 may apply the input signal $IS_1$ and the output delay signals $DIS_1, DIS_2, \ldots,$ and $DIS_{2n-1}$ to the oscillation signal generator 20.

Figure 3:
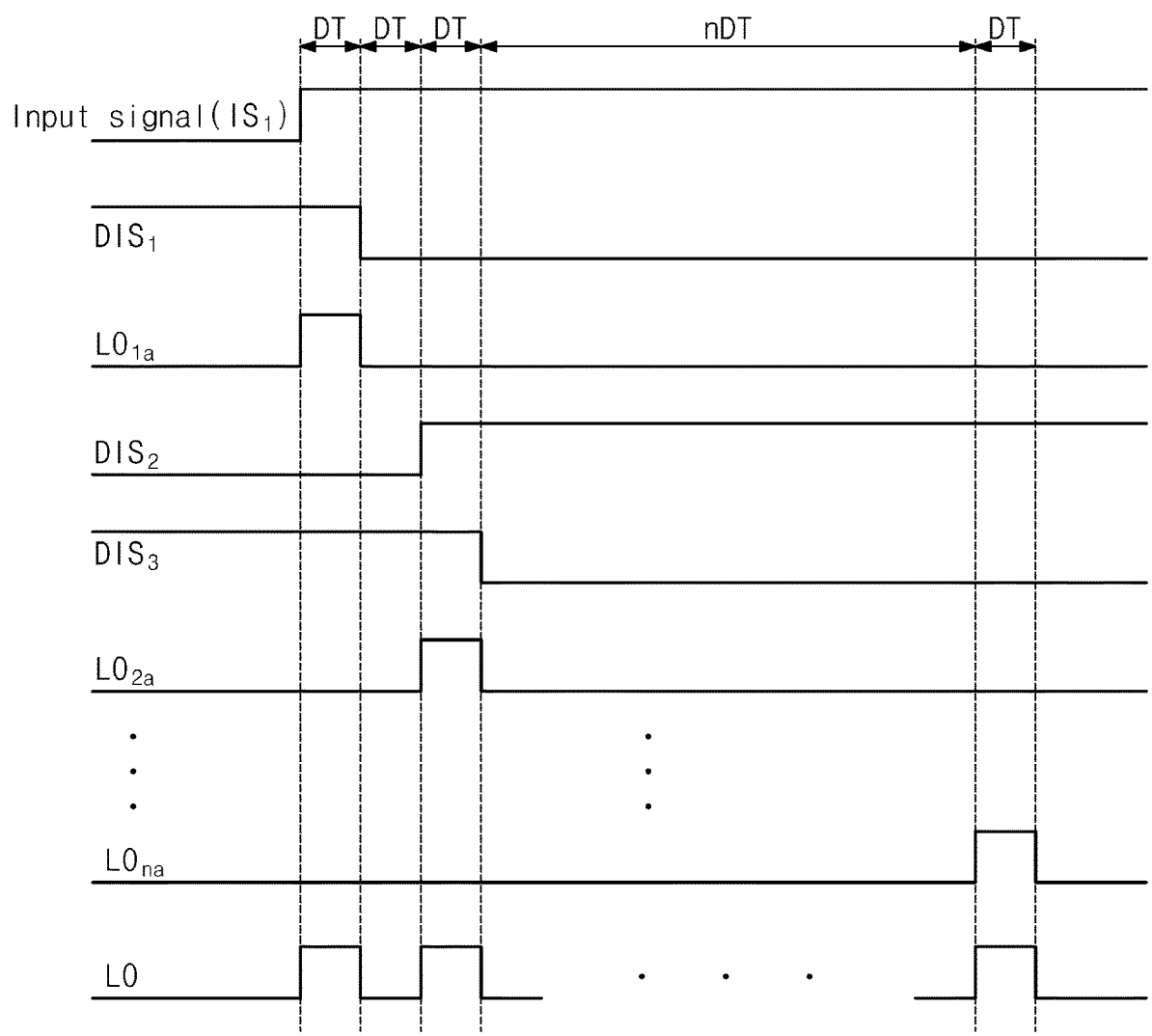
FIG. 3 is a waveform diagram illustrating a process of generating an oscillation signal according to an embodiment of the inventive concept.

Referring to FIGS. 2 and 3, the 1ath delay element $D_{1a}$ may change a phase of the input signal $IS_1$ to the opposite (180 degrees) and may delay the input signal $IS_1$ by a first delay duration DT to generate the first output delay signal $DIS_1$. The 2ath delay element $D_{2a}$ may change a phase of the first output delay signal $DIS_1$ to the opposite (180 degrees) and may delay the first output delay signal $DIS_1$ by the first delay duration DT to generate the second output delay signal $DIS_2$.

The (2n-2)ath delay element $D_{(n-1)a}$ may change a phase of the 2n-3rd output delay signal $DIS_{2n-3}$ to the opposite (180 degrees) and may delay the 2n-3rd output delay signal $DIS_{2n-3}$ by the first delay duration DT to generate the 2n-2nd output delay signal $DIS_{2n-2}$. The (2n-1)ath delay element $D_{na}$ may change a phase of the 2n-2nd output delay signal $DIS_{2n-2}$ to the opposite (180 degrees) and may delay the 2n-2nd output delay signal $DIS_{2n-2}$ by the first delay duration DT to generate the 2n-1st output delay signal $DIS_{2n-1}$.

In detail, the 1ath delay element $D_{1a}$ will be described as an example. The phase of the input signal $IS_1$ may change to the opposite (180 degrees) through the 1ath delay element $D_{1a}$ (or the inverter element). Furthermore, according to an operation of a 1ath switch $S_{1a}$ connected between the 1ath delay element $D_{1a}$ and the second delay element $D_{2a}$, the input signal $IS_1$, the phase of which changes to the opposite (180 degrees), may be stored in the 1ath capacitor $C_{1a}$ during a turn-on/turn-off interval (or the first delay duration DT) of the 1ath switch $S_{1a}$.

As a result, the 1ath delay element $D_{1a}$, the 1ath switch S1a, and the 1ath capacitor C1a may change the phase of the input signal IS1 to the opposite (180 degrees) and may delay the input signal IS1 by the first delay duration DT to generate the first output delay signal $DIS_1$. Because a process of generating second to 2n-1st output delay signals DIS2, . . . , and DIS2n-1 is substantially the same as the process of generating the first output delay signal DIS1, it will be omitted.

The oscillation signal generator 20 may include a plurality of first AND gates $AND_{1a}, AND_{2a}, \ldots,$ and $AND_{na}$, a signal synthesizer 21, and an oscillation signal output device 22.

The 1ath AND gate $AND_{1a}$ may be connected with an input terminal and an output terminal of the 1ath delay element $D_{1a}$. The 1ath AND gate $AND_{1a}$ may AND the input signal $IS_1$ and the first output delay signal $DIS_1$ to generate a 1ath sub-oscillation signal $LO_{1a}$.

Referring to FIG. 3, a rising edge of the 1ath sub-oscillation signal $LO_{1a}$ may occur at a time point when the input signal $IS_1$ rises. A falling edge of the 1ath sub-oscillation signal $LO_{1a}$ may occur at a time point when the first output delay signal $DIS_1$ falls.

The 1ath sub-oscillation signal LO1a may have a certain high voltage level and may be kept constant between the time point when the rising edge of the 1ath sub-oscillation signal $LO_{1a}$ occurs and the time point when the falling edge of the 1ath sub-oscillation signal $LO_{1a}$ occurs. The 1ath sub-oscillation signal LO1a may have a certain low voltage level and may be kept constant at a time point before the rising edge of the 1ath sub-oscillation signal LO1a occurs and at a time point after the falling edge of the 1ath sub-oscillation signal LO1a occurs.

The nath AND gate $AND_{na}$ may be connected with an input terminal and an output terminal of the nth delay element $D_{1n}$. The nath AND gate $AND_{na}$ may AND the 2n-2nd output delay signal $DIS_{2n-2}$ and the 2n-1st output delay signal $DIS_{2n-1}$ to generate an nath sub-oscillation signal $LO_{na}$.

A rising edge of the nath sub-oscillation signal $LO_{na}$ may occur at a time point when the 2n-2nd output delay signal $DIS_{2n-2}$ rises. A falling edge of the nath sub-oscillation signal $LO_{na}$ may occur at a time point when the 2n-1st output delay signal DIS2n-1 falls. The nath sub-oscillation signal LOna may have a certain high voltage level and may be kept constant between the time point when the rising edge of the nath sub-oscillation signal $LO_{na}$ occurs and the time point when the falling edge of the nath sub-oscillation signal LOna occurs. The nath sub-oscillation signal LOna may have a certain low voltage level and may be kept constant at a time point before the rising edge of the nath sub-oscillation signal LOna occurs and at a time point after the falling edge of the nath sub-oscillation signal $LO_{na}$ occurs.

The signal synthesizer 21 may be connected with the 1ath to nath AND gates $AND_{1a}$, $AND_{2a}$, . . . , and $AND_{na}$. The signal synthesizer 21 may be composed of a plurality of OR gates. The signal synthesizer 21 may OR the 1ath to nath sub-oscillation signals $LO_{1a}$, $LO_2$, . . . , and $LO_{na}$ to generate an oscillation signal (an LO signal) having n pulses during a target impulse duration.

The oscillation signal output device 22 may provide the oscillation signal (the LO signal) to the impulse signal generator 40.

As described above in FIGS. 2 and 3, the first delay line 600 and the oscillation signal generator 20 according to an embodiment of the inventive concept may generate the oscillation signal (the LO signal) having a certain number of pulses during the target impulse duration depending on the number of the first delay elements $D_{1a}$, $D_{2a}$, $D_{3a}$, . . . provided in the first delay line 600. The first delay line 600 and the oscillation signal generator 20 according to an embodiment of the inventive concept may generate the oscillation signal (the LO signal) having the certain number of pulses during only the target impulse duration, thus subsequently decreasing power consumption in the process of generating the impulse signal.

Figure 4:
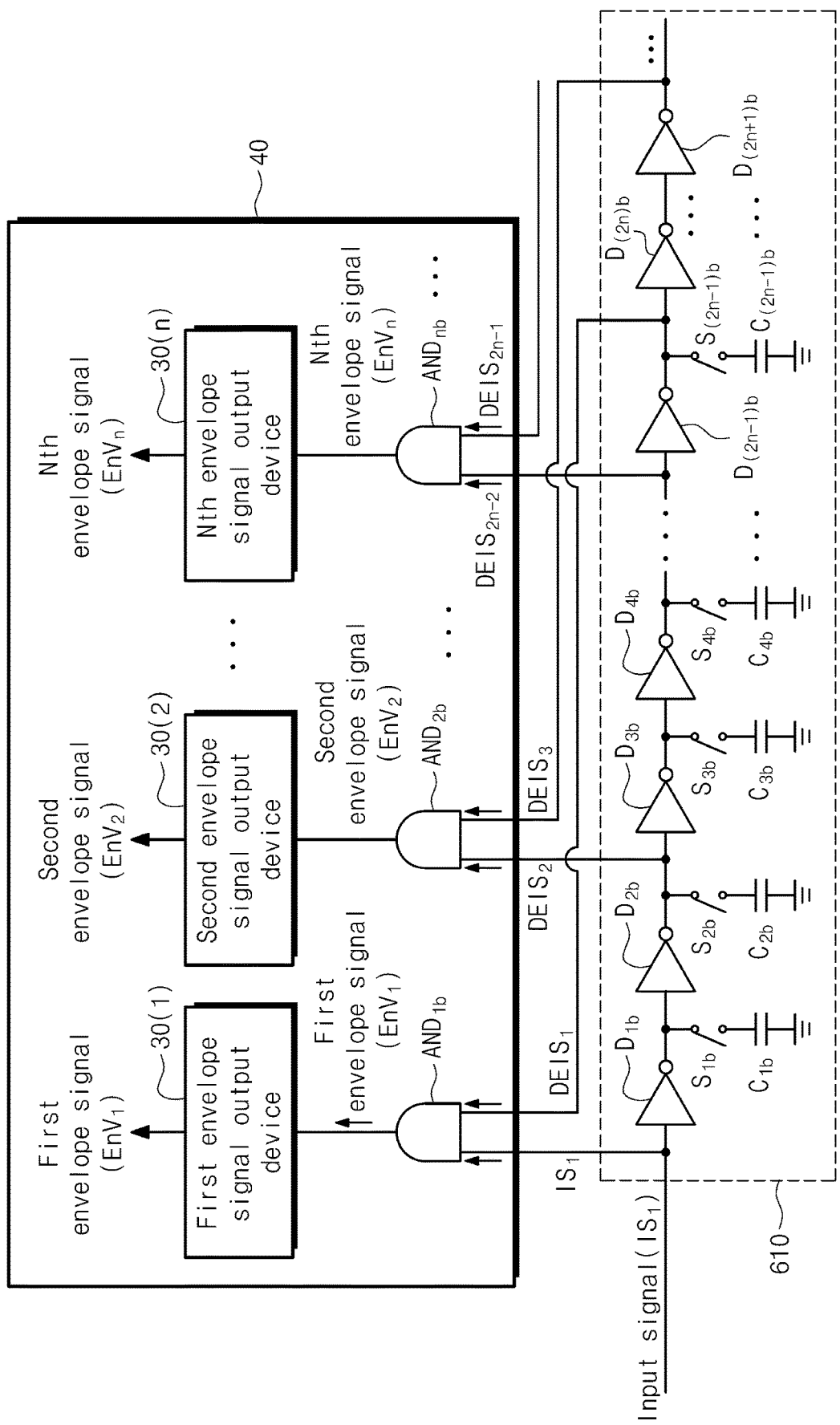
FIG. 4 is a drawing illustrating an envelope signal generator and a delay line according to an embodiment of the inventive concept.

FIG. 4 is a drawing illustrating an envelope signal generator and a delay line according to an embodiment of the inventive concept. FIG. 5 is a waveform diagram illustrating a process of generating an envelope signal according to an embodiment of the inventive concept.

Hereinafter, a description will be given of a process of generating a plurality of envelope signals EnV1, EnV2, . . . , and EnVn in an envelope signal generator 30 and a second delay line 610 with reference to FIGS. 4 and 5.

Referring to FIG. 4, the second delay line 610 may include a plurality of second delay elements $D_{1b}$, $D_{2b}$, . . . $D_{(2n-1)b}$, . . . , and $D_{(4n-3)b}$ connected in series with each other and at least one second switch $S_{1b}$, $S_{2b}$, . . . $S_{(2n-1)b}$, . . . , and $S_{(4n-3)b}$ and at least one second capacitor $C_{1b}$, $C_{2b}$, . . . , $C_{(2n-1)b}$, . . . , $C_{(4n-3)b}$ between the plurality of second delay element $D_{1b}$, $D_{2b}$, . . . , $D_{(2n-1)b}$, . . . , and $D_{(4n-3)b}$. At this time, the second delay element may be an inverter element.

The second delay line 610 may generate a plurality of envelope delay signals $DEIS_1$, $DEIS_2$, . . . , $DEIS_{2n-1}$ based on an input signal $IS_1$ applied from an input signal generator 10. The second delay line 610 may apply the input signal IS1 and the plurality of envelope delay signals DEIS1, DEIS2, . . . , DEIS2n-1 to an oscillation signal generator 20.

Figure 5:
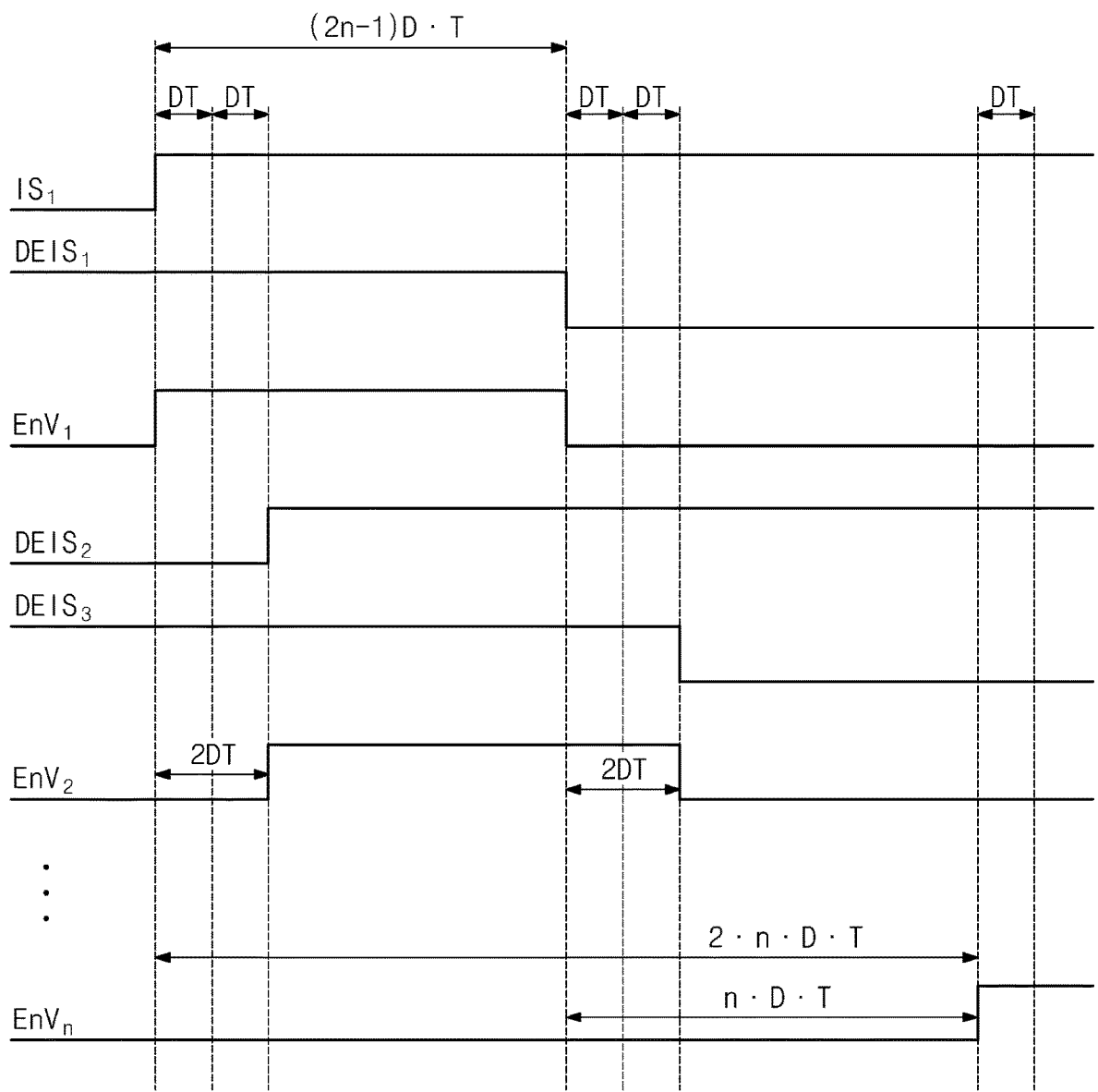
FIG. 5 is a waveform diagram illustrating a process of generating an envelope signal according to an embodiment of the inventive concept.

Referring to FIGS. 4 and 5, the 1bth to (2n-1)bth delay elements $D_{1b}$, $D_{2b}$, and $D_{(2n-1)b}$ may change a phase of the input signal $IS_1$ to the opposite (180 degrees) and may delay the input signal $IS_1$ by a second delay duration (2n-1)DT to generate the first envelope delay signal $DEIS_1$.

The 1bth and 2bth delay elements $D_{1b}$ and $D_{2b}$ may change the phase of the input signal $IS_1$ to the opposite (180 degrees) two times and may delay the input signal $IS_1$ by a third delay duration 2DT to generate the second envelope delay signal $DEIS_2$. The 3bth to (2n+1)bth delay elements $D_{3b}$, $D_{4b}$, . . . , D(2n+1)b may change a phase of the second envelope delay signal DEIS2 to the opposite (180 degrees) and may delay the second envelope delay signal DEIS2 by the second delay duration (2n-1)DT to generate the third envelope delay signal DEIS3.

In detail, the 1bth to (2n-1)bth delay elements $D_{1b}$, . . . , and $D_{(2n-1)b}$ will be described an example. The phase of the input signal $IS_1$ may change to the opposite (180 degrees) through the 1bth to (2n-1)bth delay elements $D_{1b}$, . . . , and $D_{(2n-1)b}$ (or the inverter elements). Furthermore, according to operations of the 1bth to (2n-1)bth switches S1b, S2b, . . . , and S(2n-1)b connected between the 1bth to (2n-1)bth delay elements D1b, . . . , and D(2n-1)b, the input signal IS1, the phase of which changes to the opposite (180 degrees), may be stored in the 1bth to (2n-1)bth capacitors C1b, C2b, C(2n-1)b during a turn-on/turn-off interval (or the second delay duration (2n-1)DT) of the 1bth to (2n-1) bth switches S1b, S2b, . . . , and S(2n-1)b.

As a result, the 1bth to (2n-1)bth delay elements $D_{1b}$, . . . , and $D_{(2n-1)b}$, the 1bth to (2n-1)bth switches S1b, S2b, . . . , and S(2n-1)b, and the 1bth to (2n-1)bth capacitors C1b, C2b, . . . , C(2n-1)b may change the phase of the input signal IS1 and may delay the input signal IS1 by the second delay duration (2n-1)DT to generate the first envelope delay signal DEIS1. Because a process of generating second to 2n-1st envelope delay signals DEIS2, DEIS3, . . . , DEIS2n-1 is substantially the same as the process of generating the first envelope delay signal DEIS1, it will be omitted.

The envelope signal generator 30 may include a plurality of second AND gates AND1b, AND2b, . . . , and ANDnb and a plurality of envelope signal output units 30(1), 30(2), . . . , and 30(n).

The 1bth AND gate $AND_{1b}$ may be connected with an input terminal of the 1bth delay element $D_{1b}$ and an output terminal of the (2n-1)bth delay element $D_{(2n-1)b}$. The 1bth AND gate $AND_{1b}$ may AND the input signal $IS_1$ and the first envelope delay signal $DEIS_1$ to generate the first envelope signal $EnV_1$.

Referring to FIG. 5, a rising edge of the first envelope signal EnV1 may occur at a time point when the input signal $IS_1$ rises. A falling edge of the first envelope signal $EnV_1$ may occur at a time point when the first envelope delay signal $DEIS_1$ falls.

The first envelope signal $EnV_1$ may have a certain high voltage level and may be kept constant between the time point when the rising edge of the first envelope signal $EnV_1$ occurs and the time point when the falling edge of the first envelope signal EnV1 occurs. The first envelope signal EnV1 may have a certain low voltage level and may be kept constant at a time point before the rising edge of the first envelope signal EnV1 occurs and at a time point after the falling edge of the first envelope signal EnV1 occurs.

The nbth AND gate $AND_{nb}$ may be connected with an input terminal of the (2n−1)bth delay element $D_{(2n-1)b}$ and an output terminal of the (4n−3)bth delay element D(4n−3)b. The nbth AND gate ANDnb may AND the 2n−2nd envelop delay signal DEIS2n−2 and the 2n−1st envelope delay signal DEIS2n−1 to generate the nth envelope signal EnVn.

Referring to FIG. 5, a rising edge of the nth envelope signal $EnV_n$ may occur at a time point when the 2n−2nd envelope delay signal $DEIS_{2n-2}$ rises. A falling edge of the nth envelope signal $EnV_n$ may occur at a time point when the 2n−1st envelope delay signal $DEIS_{2n-1}$ falls.

The nth envelope signal $EnV_n$ may have a certain high voltage level and may be kept constant between the time point when the rising edge of the nth envelope signal $EnV_n$ occurs and the time point when the falling edge of the nth envelope signal EnVn occurs. The nth envelope signal EnVn may have a certain low voltage level and may be kept constant at a time point before the rising edge of the nth envelope signal EnVn occurs and at a time point after the falling edge of the nth envelope signal EnVn occurs.

The first to nth envelope signal output devices 30(1), 30(2), . . . , and 30(n) may provide the first to nth envelope signals $EnV_1$, . . . , and $EnV_n$ to the impulse signal generator 40.

As described above in FIGS. 4 and 5, the second delay line 610 and the envelope signal generator 30 according to an embodiment of the inventive concept may generate the certain number (e.g., n) of envelope signals during the target impulse duration in response to the number of the delay elements D1b, D2b, . . . provided in the second delay line 610, thus decreasing power consumption in the process of generating the impulse signal.

Figure 6:
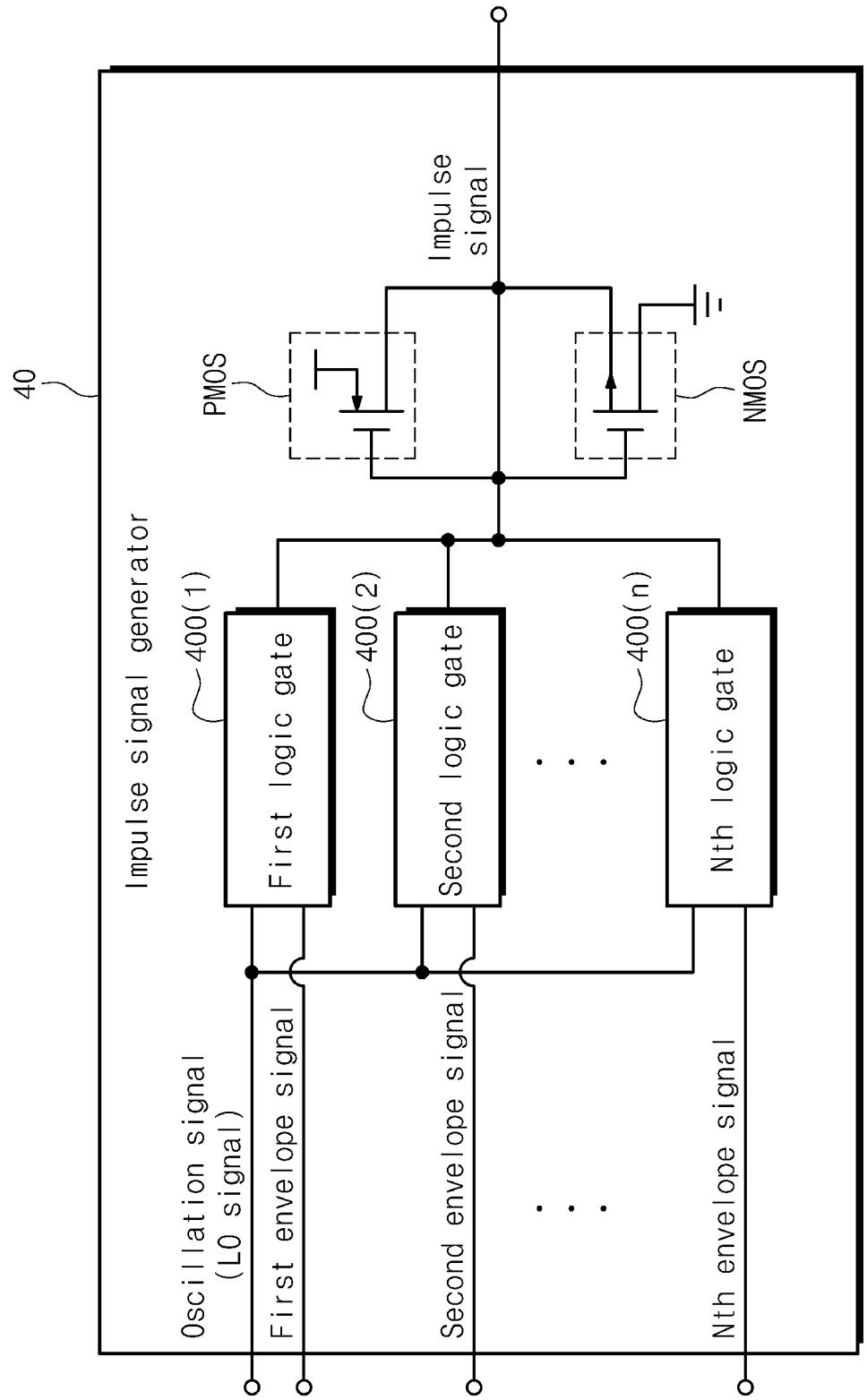
FIG. 6 is a drawing illustrating an impulse signal generator according to an embodiment of the inventive concept.
Figure 7:
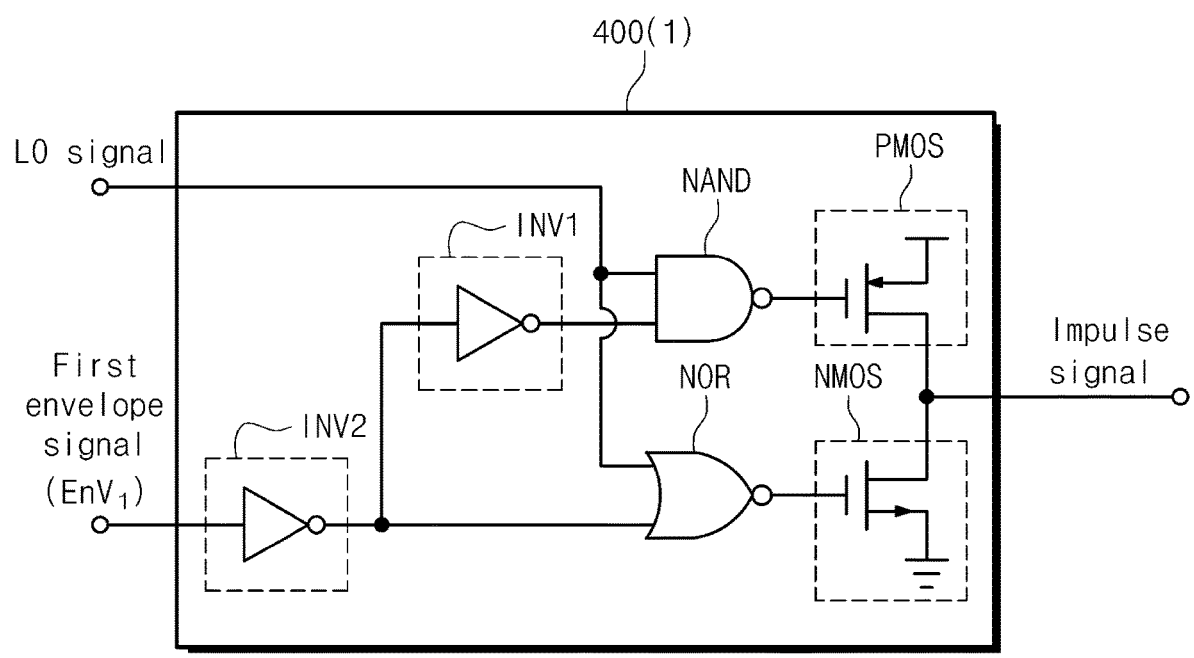
FIG. 7 is a drawing illustrating a logic gate according to an embodiment of the inventive concept.

FIG. 6 is a drawing illustrating an impulse signal generator according to an embodiment of the inventive concept. FIG. 7 is a drawing illustrating a logic gate according to an embodiment of the inventive concept.

Hereinafter, a description will be given of a process of generating an impulse signal using an oscillation signal (an LO signal) and a plurality of envelope signals according to an embodiment of the inventive concept with reference to FIGS. 6 and 7.

An impulse signal generator 40 according to an embodiment of the inventive concept may include a plurality of logic gates 400(1), 400(2), . . . , and 400(p), a first transistor (or a PMOS transistor), and a second transistor (or an NMOS transistor).

An oscillation signal (an LO signal) generated by an oscillation signal generator 20 may be applied in common to the first to nth logic gates 400(1), 400(2), . . . , and 400(n). First to nth envelope signals EnV1, . . . , and EnVn generated by the envelope signal generator 30 may be applied to the first to nth logic gates 400(1), 400(2), . . . , and 400(n).

Referring to FIG. 6, the first logic gate 400(1) may include a first inverter INV1, a second inverter INV2, a NAND gate NAND, and a NOR gate NOR.

The oscillation signal (the LO signal) may be applied in common to the NAND gate NAND and the NOR gate NOR of the first logic gate 400(1). The first envelope signal EnV1 output from the first envelope signal output device 30(1) may be applied to the NAND gate NAND through the first inverter INV1 and the second inverter INV2. The first envelope signal EnV1 output from the first envelope signal output device 30(1) may be applied to the NOR gate NOR through the second inverters INV2.

The oscillation signal (the LO signal) generated by the oscillation signal generator 20 may be applied in common to the NAND gate NAND and the NOR gate NOR of the first logic gate 400(1). The nth envelope signal EnVn output from the nth envelope signal output device 30(n) may be applied to the NAND gate NAND through the first inverter INV1 and the second inverter INV2. The nth envelope signal EnVn output from the nth envelope signal output device 30(n) may be applied to the NOR gate NOR through the second inverters INV2.

The impulse signal passing through the first to nth logic gates 400(1), . . . , and 400(n) may be output to the outside according to operations of a first transistor (or a PMOS transistor) PMOS and a second transistor (or an NMOS transistor) NMOS.

Figure 8:
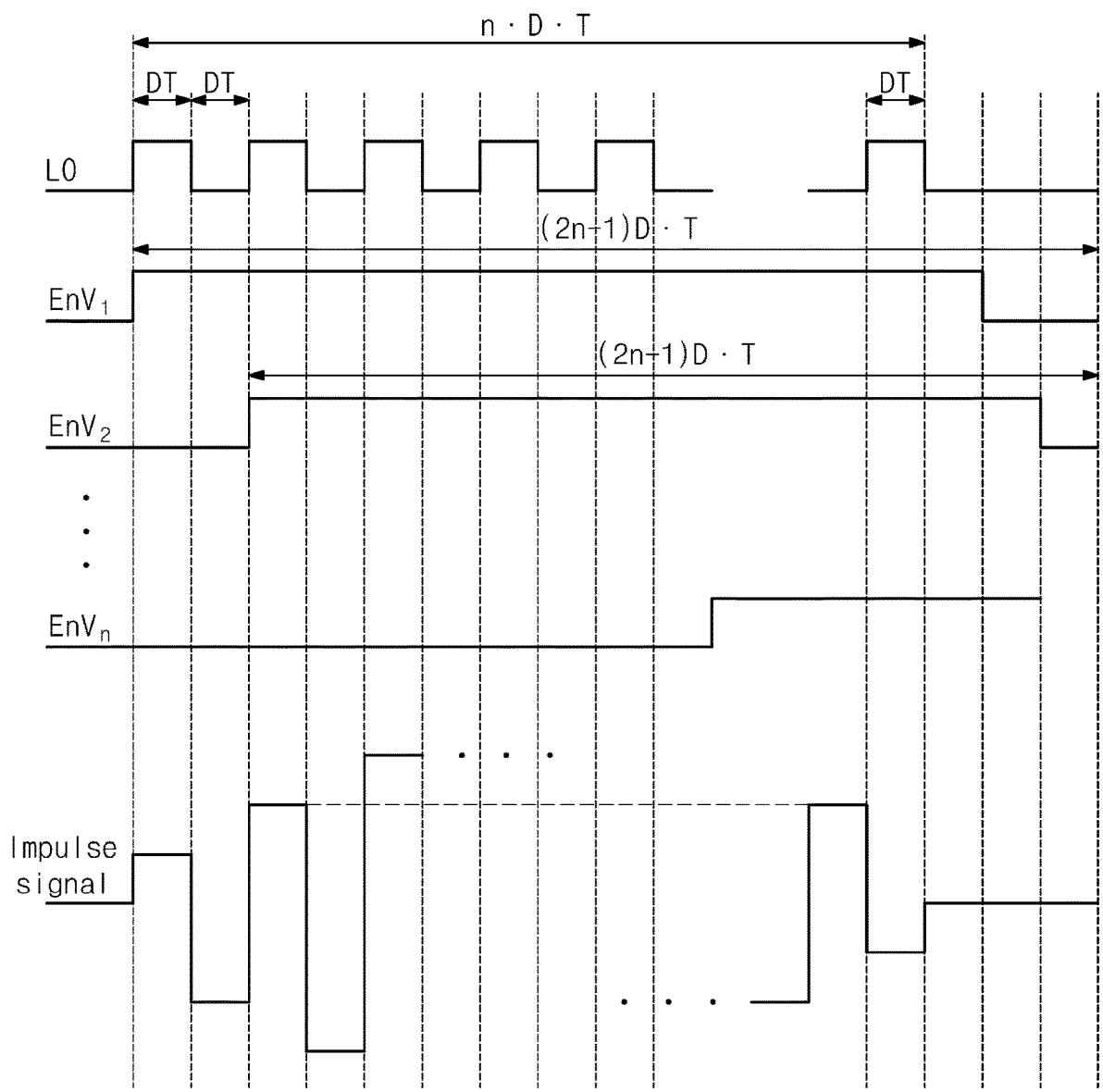
FIG. 8 is a waveform diagram illustrating a process of generating an impulse signal according to an embodiment of the inventive concept.

FIG. 8 is a waveform diagram illustrating a process of generating an impulse signal according to an embodiment of the inventive concept.

Referring to FIG. 8, an oscillation signal (or an LO signal) according to an embodiment of the inventive concept may have a certain number (n) of pulses depending on the number of delay elements provided in a first delay line 600 during a target impulse duration n·D·t.

Furthermore, each of a plurality of envelope signals $EnV_1$, $EnV_2$, . . . , and $EnV_n$ may have a pulse which lasts at a certain voltage level during a certain period depending on the number of delay elements provided in a second delay line 610.

The impulse signal may be generated by the oscillation signal and the plurality of envelope signals and may be generated only during the target impulse duration n·D·t which is a during when the oscillation signal is generated. Furthermore, the impulse signal may be composed of pulses, each of has the same period as a period of each of pulses making up the oscillation signal. For example, the impulse signal may have a certain number (n) of pulses like the oscillation signal. At this time, as the form of the oscillation signal (or the LO signal) may be changed in response to a form of an addition envelope signal obtained by adding the plurality of envelope signals EnV1, EnV2, . . . , EnVn, the impulse signal may be generated.

As described above in FIG. 8, the impulse signal according to an embodiment of the inventive concept may be generated by the oscillation signal and the plurality of envelope signals. At this time, the oscillation signal may be composed of pulses having a certain number only during the target impulse duration according to the number of delay elements arranged by a user. Furthermore, the number of the plurality of envelope signals may be determined according to the number of the delay elements arranged by the user. As the impulse signal is generated using the oscillation signal and the plurality of envelope signals set by the user, power consumption may be reduced.

The broadband impulse generator according to the inventive concept may generate a local oscillation (LO) signal and an envelope signal only during a time when an impulse signal is required, thus reducing power consumption.

Furthermore, the broadband impulse generator according to the inventive concept may synchronize an LO signal with an envelope signal, thus removing a phase difference.

Furthermore, the broadband impulse generator according to the inventive concept may supply an impulse signal to a low-latency system, which operates at low power and requires a long-time operation, to operate the low-latency system.

While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims. Therefore, those skilled in the art will understand that various modifications and other equivalent embodiments of the inventive concept are possible. Consequently, the true technical protective scope of the inventive concept must be determined based on the technical spirit of the appended claims.

What is claimed is:

1. A broadband impulse generator, comprising:
   a first delay line configured to receive an input signal and include a plurality of first delay elements connected in series with each other, wherein a total number of the plurality of first delay elements is 2n−1;
   a second delay line configured to receive the input signal and include a plurality of second delay elements connected in series with each other, wherein a total number of the plurality of second delay elements is 4n−3;
   an oscillation signal generator coupled to the first delay line and configured to generate an oscillation signal having a plurality of pulses during a target impulse duration based on the input signal and output signals of the first delay line, wherein n is a total number of the plurality of pulses included in the oscillation signal;
   an envelope signal generator coupled to the second delay line and configured to generate a plurality of envelope signals having a delay duration with each other and having a voltage level during the target impulse duration, based on the input signal and output signals of the second delay line, wherein a total number of the plurality of envelope signals is n; and
   an impulse signal generator configured to generate an impulse signal having the plurality of pulses during the target impulse duration based on the plurality of envelope signals and the oscillation signal.

2. The broadband impulse generator of claim 1, wherein the oscillation signal generator includes:
   a plurality of first AND gates connected with an input terminal and an output terminal of a 2n−1st first delay element of the first delay line and configured to AND a signal applied to the input terminal and a signal output from the output terminal to generate sub-oscillation signals;
   a signal synthesizer connected with the plurality of first AND gates and configured to OR the sub-oscillation signals to generate the oscillation signal; and
   an oscillation signal output device configured to output the oscillation signal to the impulse signal generator.

3. The broadband impulse generator of claim 2, wherein the plurality of first delay elements are a plurality of first inverter elements, and wherein the first delay line includes at least one first switch and at least one first capacitor between the plurality of first inverter elements.

4. The broadband impulse generator of claim 2, wherein the oscillation signal generator changes a phase of the input signal to the opposite and delays the input signal by a first delay duration to generate a first output delay signal, changes a phase of a 2n−3rd output delay signal to the opposite and delays the 2n−3-rd output delay signal by the first delay duration to generate a 2n−2nd output delay signal, and changes a phase of the 2n−2nd output delay signal to the opposite and delays the 2n−2nd output delay signal by the first delay duration to generate a 2n−1st output delay signal, and
   wherein a 0th output delay signal is the same signal as the input signal.

5. The broadband impulse generator of claim 4, wherein the plurality of first AND gates AND the input signal and the first output delay signal to generate a first sub-oscillation signal and AND the 2n−2nd output delay signal and the 2n−1st output delay signal to generate an nth sub-oscillation signal.

6. The broadband impulse generator of claim 5, wherein the signal synthesizer ORs the first to nth sub oscillation signals to generate the oscillation signal having the plurality of pulses during the target impulse duration.

7. The broadband impulse generator of claim 1, wherein the envelope signal generator includes:
   a plurality of second AND gates connected with an input terminal of a pth second delay element of the second delay line and an output terminal of a p+2n−2nd second delay element of the second delay line and configured to AND a signal applied to the input terminal and a signal output from the output terminal to generate the plurality of envelope signals; and
   an envelope signal output unit connected with each of the plurality of second AND gates and configured to output the plurality of envelope signals to the impulse signal generator, and
   wherein p is a natural number greater than or equal to 1 and is less than or equal to 2n−1.

8. The broadband impulse generator of claim 7, wherein the plurality of second delay elements are a plurality of second inverter elements, and
   wherein the second delay line includes at least one second switch and at least one second capacitor between the plurality of second inverter elements.

9. The broadband impulse generator of claim 7, wherein the envelope signal generator changes a phase of the input signal to the opposite and delays the input signal by a second delay duration to generate a first envelope delay output signal, changes a phase of a 2p−2nd envelope delay output signal to the opposite and delays the 2p−2nd envelope delay output signal by the second delay duration to generate a 2p−1st envelope delay output signal, and changes a phase of the 2p−1st envelope delay output signal to the opposite and delays the 2p−1st envelope delay output signal by the second delay duration to generate a 2pth envelope delay output signal.

10. The broadband impulse generator of claim 9, wherein the plurality of second AND gates AND the input signal and the first envelope delay output signal to generate a first envelope signal having the voltage level during the target impulse duration, AND the 2p−2nd envelope delay output signal and the 2p−1st envelope delay output signal to generate a p−1st envelope signal having the voltage level during the target impulse duration, and AND the 2p−2nd envelope delay output signal and the 2p−1st envelope delay output signal to generate a pth envelope signal having the voltage level during the target impulse duration.

11. The broadband impulse generator of claim 1, wherein the impulse signal generator includes:
   a plurality of logic gates configured to receive the oscillation signal and any one of the plurality of envelope signals;
   a first transistor connected with the plurality of logic gates; and
   a second transistor connected with the plurality of logic gates and connected in parallel with the first transistor.

12. The broadband impulse generator of claim 11, wherein each of the plurality of logic gates includes:
   a first inverter element configured to receive the envelope signal;
   a second inverter element configured to receive the envelope signal passing through the first inverter element;
   a NAND gate configured to receive the oscillation signal and the envelope signal passing through the first inverter element and the second inverter element; and
   a NOR gate configured to receive the oscillation signal and the envelope signal passing through the second inverter element.

* * * * *